(12) United States Patent
Krasser et al.

(10) Patent No.: US 6,557,130 B1
(45) Date of Patent: Apr. 29, 2003

(54) CONFIGURATION AND METHOD FOR STORING THE TEST RESULTS OBTAINED BY A BIST CIRCUIT

(75) Inventors: Hans-Jürgen Krasser, München (DE); Florian Schamberger, Reichenhall (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/352,992

(22) Filed: Jul. 14, 1999

(30) Foreign Application Priority Data

Jul. 14, 1998 (DE) .......................................... 198 31 572

(51) Int. Cl.[7] .............................................. H04B 17/00
(52) U.S. Cl. ...................................... 714/733; 714/734
(58) Field of Search ................................ 714/733, 734, 714/724

(56) References Cited

U.S. PATENT DOCUMENTS

| | | | |
|---|---|---|---|
| 5,457,696 A | * | 10/1995 | Mori |
| 5,553,082 A | * | 9/1996 | Connor et al. |
| 5,568,437 A | | 10/1996 | Jamal |
| 5,644,578 A | | 7/1997 | Ohsawa |
| 5,659,551 A | | 8/1997 | Huott et al. |
| 5,742,614 A | * | 4/1998 | Cline |
| 5,764,655 A | * | 6/1998 | Kirihata et al. |
| 5,917,764 A | * | 6/1999 | Ohsawa et al. |
| 6,163,862 A | * | 12/2000 | Adams et al. |
| 6,421,789 B1 | * | 7/2002 | Ooishi |

FOREIGN PATENT DOCUMENTS

EP     0 831 401 A1     3/1998

OTHER PUBLICATIONS

Publication: "The 1Mb DRAMS—Dynamic Random Access Memory Trends", pp. 255–257.

* cited by examiner

*Primary Examiner*—Phung M. Chung
(74) *Attorney, Agent, or Firm*—Laurence A. Greenberg; Werner H. Stemer; Ralph E. Locher

(57) ABSTRACT

The memory device of a semiconductor chip is tested with a BIST circuit. The configuration and the method store the test results obtained by the BIST circuit. The test results are stored in the sense amplifiers of the memory device. In addition, it also possible for test programs for the BIST circuit to be stored in the sense amplifiers.

4 Claims, 1 Drawing Sheet

CONFIGURATION AND METHOD FOR STORING THE TEST RESULTS OBTAINED BY A BIST CIRCUIT

BACKGROUND OF THE INVENTION

FIELD OF THE INVENTION

The invention lies in the semiconductor technology field. More specifically, the invention relates to a configuration and a method for storing the test results of a semiconductor chip having a memory device, whereby the test results are obtained by a BIST circuit.

Integrated circuits and especially memory devices which are implemented in a semiconductor chip are conventionally tested with the aid of a BIST circuit (BIST=Built-In-Self-Test) with regard to their functionality. The results obtained in the course of such investigations with the aid of the BIST circuit contained in the semiconductor chip are stored in an additional SRAM (static RAM) on the semiconductor chip. In other words, another SRAM has additionally been provided heretofore on the semiconductor chip in order to store the test results obtained by the BIST circuit, for example before the results are read out prior to the conclusion of a testing sequence.

The additional SRAM requires space on the semiconductor chip which cannot then be utilized for other purposes. External storage of the test results is also not very helpful since this is associated with additional outlay stemming simply from the fact that external SRAMs have to have contact made with them and be connected separately.

SUMMARY OF THE INVENTION

It is accordingly an object of the invention to provide a configuration and a method for storing the test results obtained by a BIST circuit, which overcomes the above-mentioned disadvantages of the heretofore-known devices and methods of this general type and which allows the test results to be stored without an additional area requirement or external storage devices.

With the foregoing and other objects in view there is provided, in accordance with the invention, a semiconductor configuration, comprising a semiconductor chip having a memory device with sense amplifiers, a BIST circuit for testing the semiconductor chip connected to the memory device, whereby test results of the semiconductor chip obtained by the BIST circuit are stored in the sense amplifiers of the memory device.

In accordance with an added feature of the invention, the BIST circuit processes test programs and test programs for the BIST circuit are stored in the sense amplifiers.

With the above and other objects in view there is also provided, in accordance with the invention, a method of storing test results of a semiconductor chip having a memory device with sense amplifiers, the method which comprises testing the semiconductor chip with a BIST circuit to obtain test results, and storing the test results obtained with the BIST circuit in the sense amplifiers of the memory device.

In other words, the objects are satisfied by storing the test results in the sense amplifiers of the memory device itself. The test programs for the BIST circuit can also be stored in these sense amplifiers.

The present invention thus uses the sense amplifiers—which are present in any case—of a memory device realized in a semiconductor chip for storing the test results and/or the test programs of BIST circuits.

The invention takes a completely different path from the prior art: instead of an SRAM which can be realized in the semiconductor chip itself or else externally, the sense amplifiers of the memory device realized in the semiconductor chip are used to store the test results of the BIST circuit. A not inconsiderable saving in terms of area can thus be obtained: this is because no additional SRAMs are required for storing the test results of the BIST circuit. Rather, the test results are stored in the sense amplifiers already present, with the result that a memory device configuration that is neutral in respect of area is thus possible. Specifically, no additional outlay at all is required in order to be able to store these measurement results.

In accordance with a concomitant feature of the invention, there is claimed the use of the sense amplifiers of a memory device realized in a semiconductor chip for storing the test results and/or the test programs of a BIST circuit.

Other features which are considered as characteristic for the invention are set forth in the appended claims.

Although the invention is illustrated and described herein as embodied in a configuration and method for storing the test results obtained by a BIST circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole FIGURE is a block diagrammatic of the configuration according to the invention.

DESCRIPTION OF THE PREFERRED EMBODIMENTS

Figure 1:
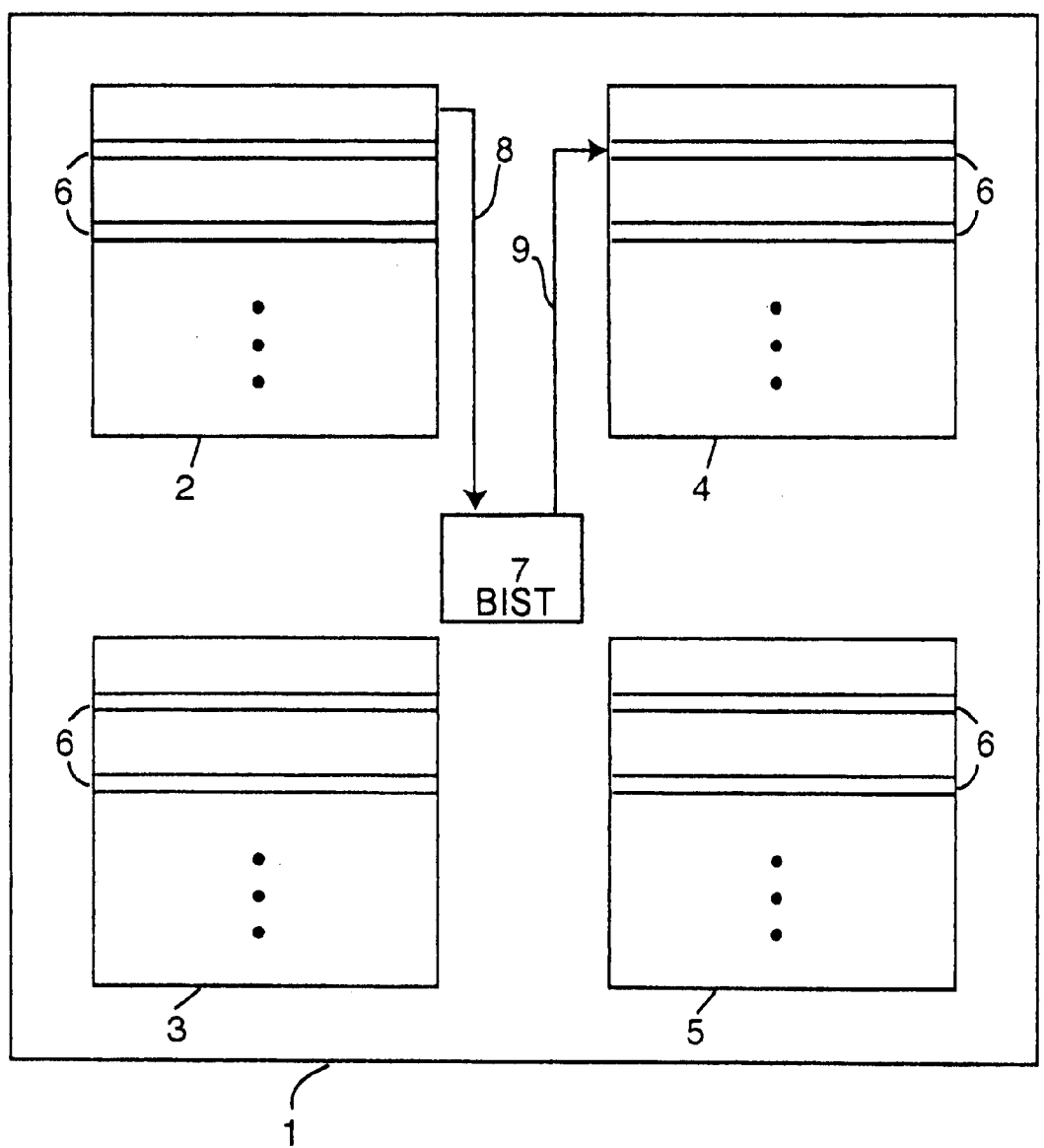

Referring now to the figures of the drawing in detail and first, particularly, to FIG. 1 thereof, there is seen a semiconductor chip 1 which comprises, for example, four memory cell arrays 2, 3, 4, 5. Each of the arrays is provided with a plurality of sense amplifier rows 6. The memory cell arrays are tested with regard to their functionality by a BIST circuit 7, as is illustrated by an arrow 8.

The measurement results of the BIST circuit 7 obtained during the test have heretofore been stored in a separate SRAM either provided on the semiconductor chip 1 itself or arranged externally with respect to the latter.

In the case of the configuration according to the invention and in the case of the method according to the invention, such a separate SRAM is not needed in order to store the test results of the BIST circuit 7. Rather, the test results are stored in a sense amplifier 6 of a memory cell array, for example of the memory cell array 4 in the present case. The test results can then be read out after the conclusion of the test series. This is particularly advantageous if the data of the test results are processed further on the semiconductor chip 1, memory nodes serving as buffer stores or registers.

Consequently, in the case of the configuration according to the invention and in the case of the method according to the invention, no additional space is required on the semiconductor chip 1 in order to be able to store the measurement results obtained by the BIST circuit. Rather, in contrast to the prior art, the measurement results are stored in the sense amplifiers of a memory cell array which is not currently being tested by the BIST circuit. Once the testing of the relevant memory cell array has been concluded, the sense amplifier of a different memory cell array, the sense amplifier storing the test results, can be read out.

It follows from the foregoing that a solution to the problem outlined above has been found which is completely neutral in respect of area: additional SRAMs are not required, rather the measurement results can be stored with the aid of the existing provisions.

We claim:

1. A semiconductor configuration, comprising a semiconductor chip having a memory device with sense amplifiers, a BIST circuit for testing said semiconductor chip connected to said memory device, whereby test results of said semiconductor chip obtained by said BIST circuit are stored in said sense amplifiers of said memory device.

2. The configuration according to claim 1, wherein said BIST circuit processes test programs and said sense amplifiers have the test programs for said BIST circuit stored therein.

3. A method of storing test results of a semiconductor chip having a memory device with sense amplifiers, the method which comprises testing the semiconductor chip with a BIST circuit to obtain test results, and storing the test results obtained with the BIST circuit in the sense amplifiers of the memory device.

4. The method according to claim 3, wherein test programs for the BIST circuit are stored in the sense amplifiers.

* * * * *